United States Patent
Liu et al.

(10) Patent No.: US 9,484,535 B1
(45) Date of Patent: Nov. 1, 2016

(54) HIGH DENSITY RESISTIVE RANDOM ACCESS MEMORY (RRAM)

(71) Applicant: STMicroelectronics, Inc., Coppell, TX (US)

(72) Inventors: Qing Liu, Irvine, CA (US); John Hongguang Zhang, Fishkill, NY (US)

(73) Assignee: STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 14/960,712

(22) Filed: Dec. 7, 2015

Related U.S. Application Data

(62) Division of application No. 14/688,597, filed on Apr. 16, 2015, now Pat. No. 9,305,974.

(51) Int. Cl.
*H01L 21/4763* (2006.01)
*H01L 45/00* (2006.01)
*H01L 27/24* (2006.01)

(52) U.S. Cl.
CPC ....... *H01L 45/1633* (2013.01); *H01L 27/2436* (2013.01)

(58) Field of Classification Search
CPC ............... H01L 27/2436; H01L 45/16; H01L 45/1233; H01L 45/145; H01L 45/1253; H01L 29/7304; H01L 27/24; H01L 45/04; H01L 51/05; H01L 45/06
USPC ........ 438/151, 197, 199, 171, 133, 382, 630
See application file for complete search history.

(56) References Cited

U.S. PATENT DOCUMENTS

| | | |
|---|---|---|
| 2011/0278528 A1 | 11/2011 | Lung et al. |
| 2011/0278676 A1 | 11/2011 | Cheng et al. |
| 2014/0166961 A1 | 6/2014 | Liao et al. |
| 2014/0169062 A1 | 6/2014 | Lee et al. |
| 2014/0203236 A1 | 7/2014 | Chen et al. |
| 2014/0264228 A1 | 9/2014 | Toh et al. |
| 2014/0264229 A1 | 9/2014 | Yang et al. |
| 2015/0048295 A1 | 2/2015 | Park |
| 2015/0228647 A1 | 8/2015 | Chang et al. |
| 2015/0325575 A1* | 11/2015 | Park .................... H01L 29/0653 257/401 |

* cited by examiner

*Primary Examiner* — Jarrett Stark
*Assistant Examiner* — Shahed Ahmed
(74) *Attorney, Agent, or Firm* — Gardere Wynne Sewell LLP

(57) ABSTRACT

A resistive random access memory (RRAM) structure is formed on a supporting substrate and includes a first electrode and a second electrode. The first electrode is made of a silicided fin on the supporting substrate and a first metal liner layer covering the silicided fin. A layer of dielectric material having a configurable resistive property covers at least a portion of the first metal liner. The second electrode is made of a second metal liner layer covering the layer of dielectric material and a metal fill in contact with the second metal liner layer. A non-volatile memory cell includes the RRAM structure electrically connected between an access transistor and a bit line.

16 Claims, 8 Drawing Sheets

HIGH DENSITY RESISTIVE RANDOM ACCESS MEMORY (RRAM)

CROSS-REFERENCE TO RELATED APPLICATION

This application is a divisional application from U.S. patent application Ser. No. 14/688,597 filed Apr. 16, 2015, the disclosure of which is incorporated by reference.

TECHNICAL FIELD

The present invention relates to integrated circuits and, in particular, to a semiconductor non-volatile memory of the resistive random access memory (RRAM) type.

BACKGROUND

With respect to non-volatile integrated circuit memory devices, resistive random access memory (RRAM) is an emerging technology. An RRAM device is a memory structure which stores a bit of data using resistance values (rather than electronic charge). Each RRAM cell includes a layer of resistive material whose resistance value can be changed to represent the storage of a logic "0" or a logic "1" bit of data. The resistive material, typically in the form of a dielectric layer, can be made to conduct through a filament or conduction path formed by the application of a first programming voltage across the dielectric layer. In the conductive state, the cell is programmed to store one of the logic "0" or logic "1" data values. The filament or conduction path may be reset, rendering the dielectric layer non-conductive, by the application of a second programming voltage across the dielectric layer. In the non-conductive state, the cell is programmed to store the other of the logic "0" or logic "1" data values.

There is a need in the art to provide an RRAM cell structure suitable to high density applications.

SUMMARY

In an embodiment, a non-volatile integrated circuit memory cell comprises: a supporting substrate; a resistive random access memory structure comprising: a first electrode, comprising: a silicided semiconductor fin on said supporting substrate; and a first metal liner layer covering said silicided semiconductor fin; a layer of dielectric material having a configurable resistive property and covering at least a portion of said first metal liner; and a second electrode, comprising: a second metal liner layer covering said layer of dielectric material; and a metal fill in contact with the second metal liner layer; a transistor having a first source-drain terminal connected to one of the first and second electrodes; a source line connected to a second source-drain terminal of the transistor; a word line connected to a gate terminal of the transistor; and a bit line connected to another of the first and second electrodes.

In an embodiment, a resistive random access memory (RRAM) structure comprises: a supporting substrate; a first electrode, comprising: a silicided semiconductor fin on said supporting substrate; and a first metal liner layer covering said silicided semiconductor fin; a layer of dielectric material having a configurable resistive property and covering at least a portion of said first metal liner; and a second electrode, comprising: a second metal liner layer covering said layer of dielectric material; and a metal fill in contact with the second metal liner layer.

In an embodiment, a method comprises: patterning a bulk semiconductor substrate to form a semiconductor fin supported by a substrate; siliciding the semiconductor fin to produce a silicided semiconductor fin; depositing a first metal liner layer covering said silicided semiconductor fin; depositing a layer of dielectric material having a configurable resistive property covering said first metal liner; depositing a second metal liner layer covering said layer of dielectric material; depositing a metal fill on each side of the silicided semiconductor fin in contact with the second metal liner layer; making electrical contact to the first metal liner layer and silicided semiconductor fin to provide a first electrode of a resistive random access memory (RRAM) structure; and making electrical contact to the metal fill and second metal liner layer to provide a second electrode of the RRAM structure.

In an embodiment, a method comprises: patterning a bulk semiconductor substrate to form a semiconductor fin supported by a substrate; siliciding the semiconductor fin to produce a fully-silicided semiconductor fin; depositing a first metal liner layer covering said fully-silicided semiconductor fin; depositing a layer of dielectric material having a configurable resistive property covering said first metal liner; depositing a second metal liner layer covering said layer of dielectric material; depositing a metal fill on each side of the fully-silicided semiconductor fin in contact with the second metal liner layer; making electrical contact to the first metal liner layer and fully-silicided semiconductor fin to provide a first electrode of a resistive random access memory (RRAM) structure; and making electrical contact to the metal fill and second metal liner layer to provide a second electrode of the RRAM structure.

In an embodiment, a method comprises: patterning a bulk semiconductor substrate to form a semiconductor fin supported by a substrate; siliciding the semiconductor fin to produce a silicided semiconductor fin; depositing a layer of dielectric material having a configurable resistive property over the silicided semiconductor fin; depositing a metal material over the layer of dielectric material; making electrical contact to the silicided semiconductor fin to provide a first electrode of a resistive random access memory (RRAM) structure; and making electrical contact to the metal material to provide a second electrode of the RRAM structure.

BRIEF DESCRIPTION OF THE DRAWINGS

For a better understanding of the embodiments, reference will now be made by way of example only to the accompanying figures in which.

DETAILED DESCRIPTION OF THE DRAWINGS

Reference is now made to FIGS. 1-11 which illustrate the process steps in the formation of a resistive random access memory (RRAM) structure for use in a non-volatile memory cell. It will be understood that the drawings do not necessarily show features drawn to scale.

Figure 1:
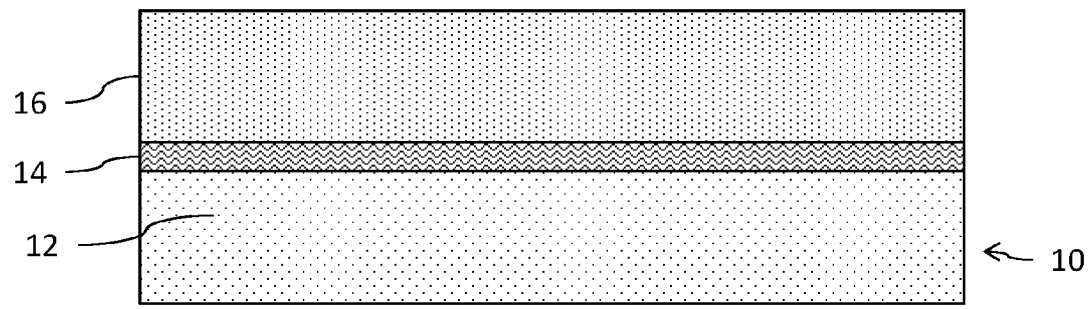
FIGS. 1-11 illustrate process steps in the formation of a resistive random access memory (RRAM) structure for use in a non-volatile memory cell.

FIG. 1 shows a silicon on insulator (SOI) semiconductor substrate 10 comprising a semiconductor substrate 12, an insulating layer 14 and a semiconductor layer 16 in a stack.

The semiconductor layer 16 may be doped in accordance with the application, or alternatively may be un-doped in which case the SOI substrate 10 is of the "fully-depleted" type. The semiconductor layer 16 may, for example, have a thickness of 35-50 nm. The insulating layer 14 is commonly referred to in the art as a buried oxide (BOX) layer.

Figure 2:
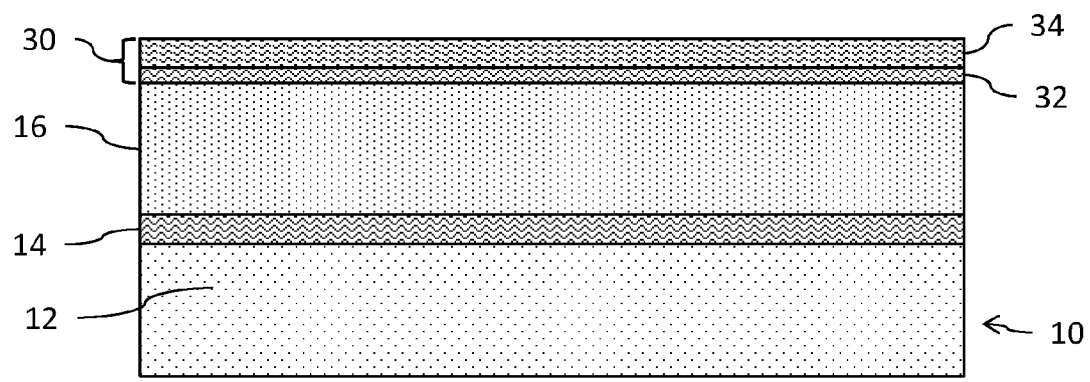

A hard mask 30 comprising a layer of silicon dioxide ($SiO_2$) 32 and a layer of silicon nitride (SiN) 34 is then deposited on the semiconductor layer 16. The silicon dioxide layer 32 may, for example, be deposited using a chemical vapor deposition (CVD) process with a thickness of, for example, approximately 3-10 nm. The silicon nitride layer 34 may, for example, be deposited using a chemical vapor deposition (CVD) process with a thickness of, for example, approximately 20-40 nm. The result is shown in FIG. 2.

Figure 3:
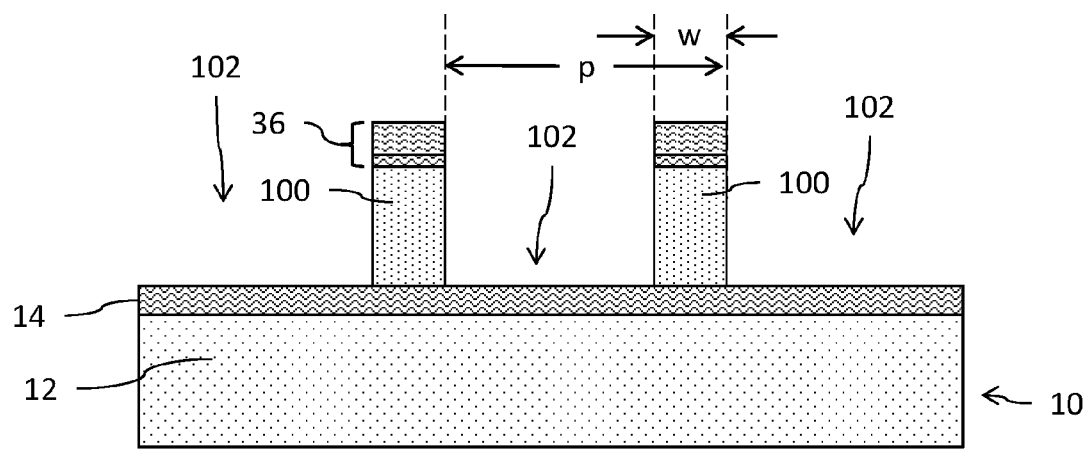

A lithographic process as known in the art is then used to define a plurality of fins 100 from the semiconductor layer 16. The hard mask 30 is patterned to leave mask material 36 at the desired locations of the fins 100. An etching operation is then performed through the mask to open apertures 102 on each side of each fin 100. In a preferred embodiment, the etch which defines the fins 100 extends to a depth which reaches the insulating layer 14. The fins 100 may have a width (w) of 6-12 nm and a pitch (p) of 25-45 nm (with a spacing between adjacent fins of 15-35 nm). The result of the etching process is shown in FIG. 3.

Figure 4:
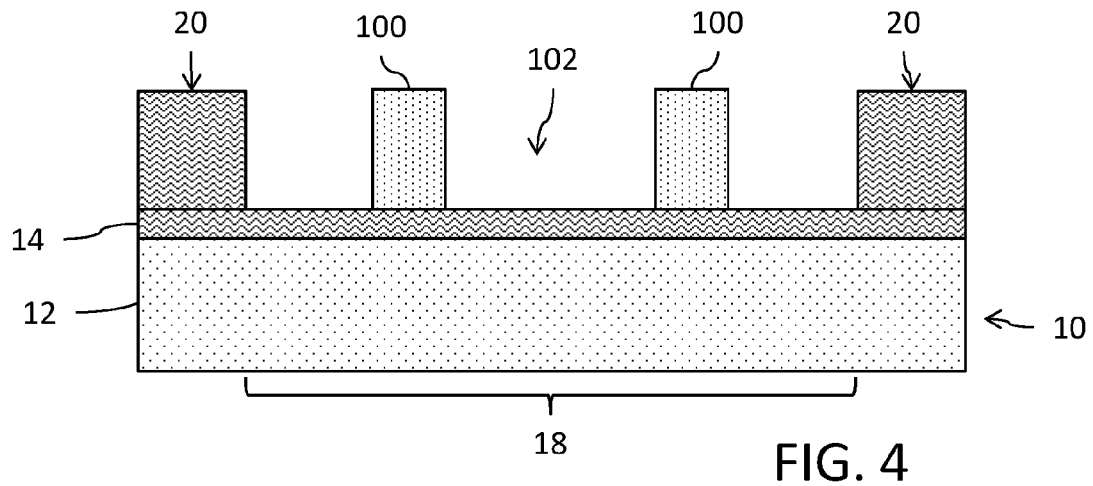

Outside of an area 18 where the fins 100 are located, the insulation such as for the shallow trench isolation (STI) is elevated as shown at reference 20. This may, for example, be accomplished by depositing a flowable oxide on the substrate followed by patterning and removal of the oxide deposit in the area 18 of the fins 100. The mask material 36 is also removed. The result is shown in FIG. 4.

Figure 5:
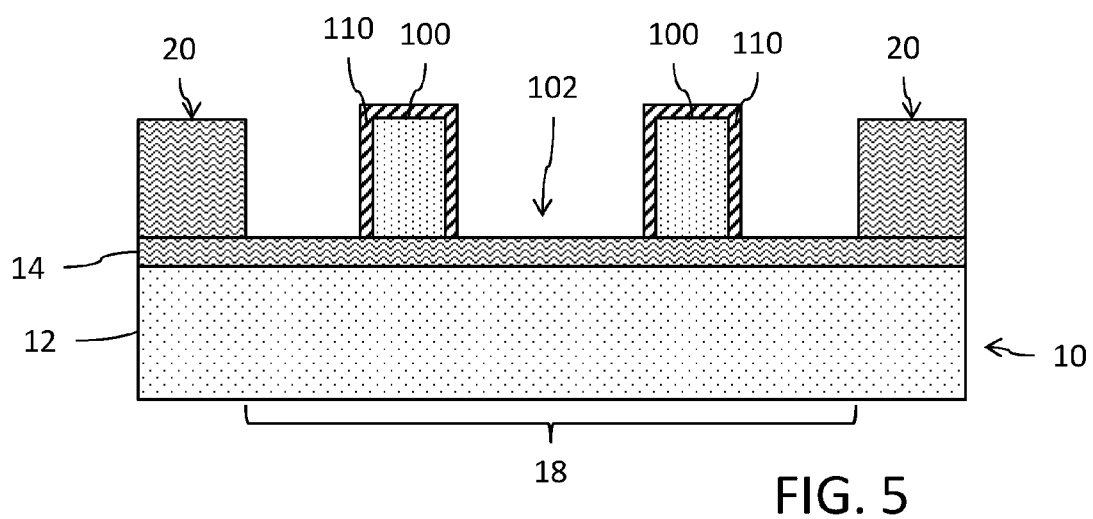
Figure 6:
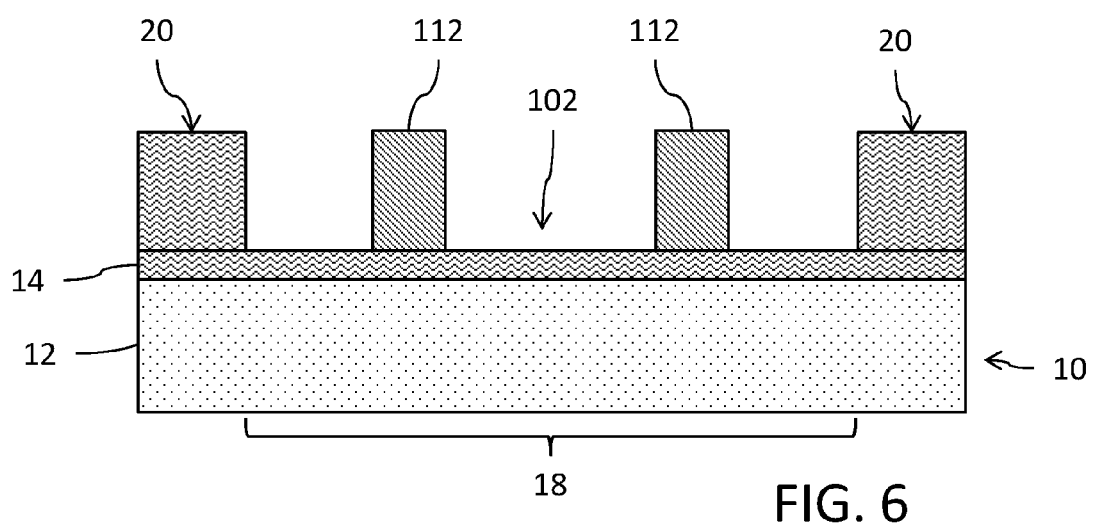

A layer 110 of nickel-platinum (NiPt) is then deposited to cover the fins 100 as shown in FIG. 5. The layer 110 may, for example, have a thickness of 3-10 nm. An anneal is then performed (for example, at 400° C. with an optional laser anneal at 800° C.). The anneal converts at least a portion of the silicon material of the fins 100 to a metal silicide (for example, $NiSi_x$) so as to convert the silicon fin material to form silicided fins 112. The unreacted portion of the layer 110 following the anneal is removed. In an embodiment, the dimensions of the fin 100, the thickness of the layer 110, the materials used and the characteristics of the anneal performed are selected so that the silicided fins 112 are fully-silicided structures (in such a case, all of the semiconductor material of fin 100 is converted to silicide). The result is shown in FIG. 6. The silicided fin 112 provides one electrode of the RRAM structure.

Figure 7:
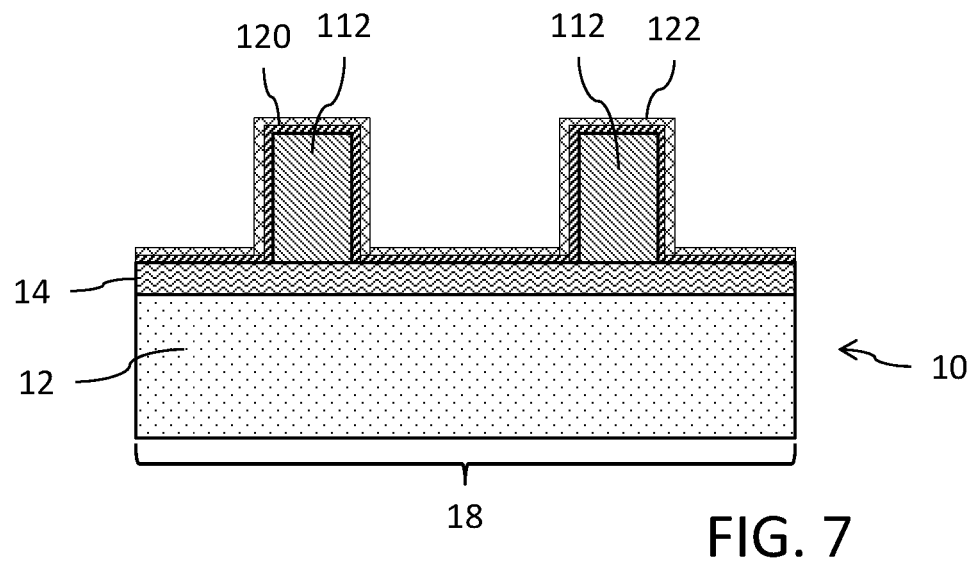

Using a chemical vapor deposition (CVD) process, a liner layer 120 of a metal material (such as, for example, titanium nitride TiN) is deposited to cover the silicided fins 112 and the insulating layer 14. The layer 120 may, for example, have a thickness of 5-10 nm. Using an atomic layer deposition (ALD) process, a layer 122 of a dielectric material (such as, for example, hafnium oxide $HfO_2$) is deposited to cover the metal layer 120. A patterning operation is performed to provide for removal of the layers 120 and 122 outside of the area 18. The result is shown in FIG. 7 which now focuses on the area 18. The layer 120 assists in the formation of a low resistivity state across the dielectric layer 122 for the RRAM operation.

Figure 8:
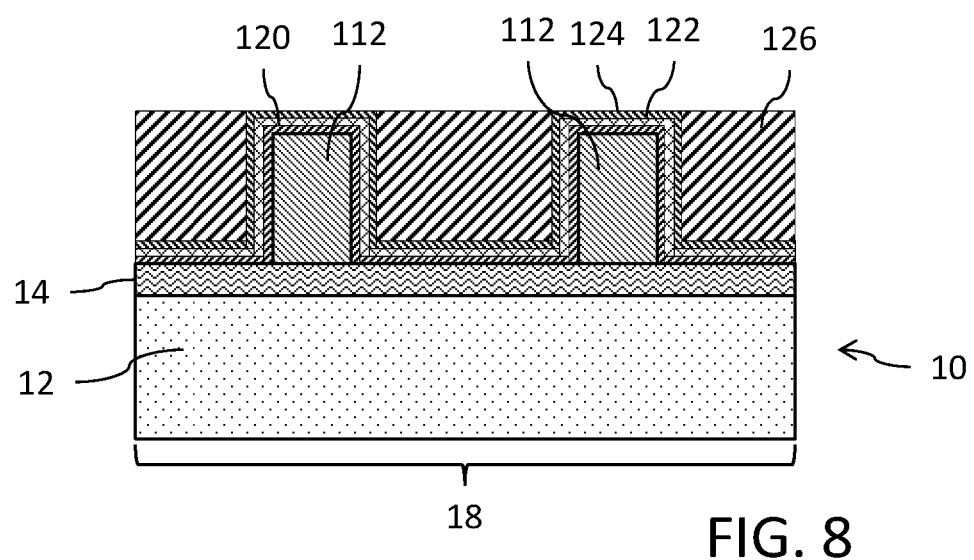

Using a chemical vapor deposition (CVD) process, a liner layer 124 of a metal material (such as, for example, titanium nitride TiN) is deposited to cover the layer 122. The layer 124 may, for example, have a thickness of 5-10 nm. The area 18 is then filled with a metal material (such as, for example, tungsten) to provide a metal fill 126. A chemical-mechanical polishing (CMP) operation is performed to planarize the top surface of the fill 126 at a level which is coplanar with the layer 124. The result is shown in FIG. 8. The layer 124 assists in the formation of a low resistivity state across the dielectric layer 122 for the RRAM operation. The metal fill 126 provides another electrode of the RRAM structure.

Figure 9:
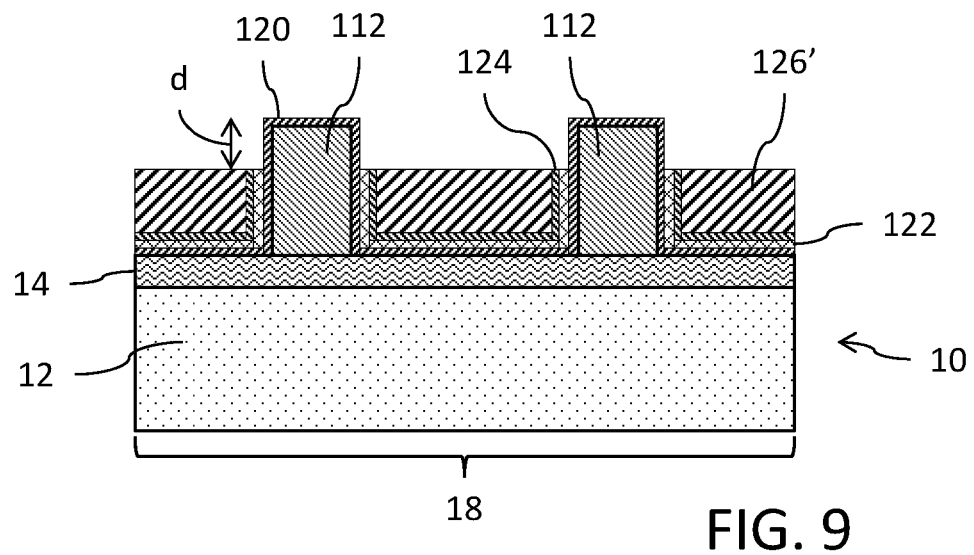

A wet etch process is then used to recess the top surface of the metal fill 126 to a level below the top surface of the silicided fins 112. The depth d of this recess operation may, for example, be 10-20 nm. The portion of the layer 124 located above the top surface of the recessed metal fill 126' is also removed (for example, using a wet stripping process). The portion of the layer 122 located above the top surface of the recessed metal fill 126' is also removed (for example, using a wet stripping process). The result is shown in FIG. 9.

Figure 10:
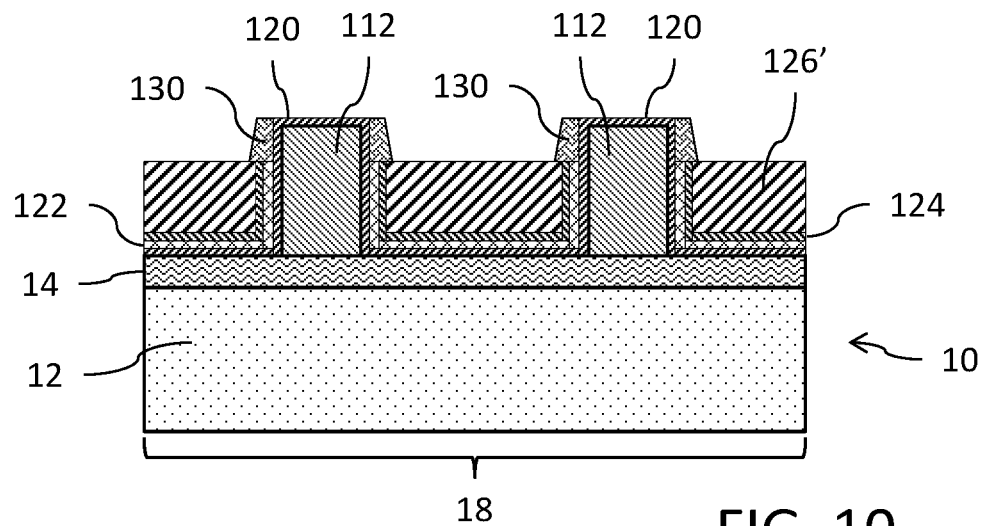

A conformal insulating material deposit is then made with a subsequent directional etch performed to define sidewall spacers 130 on the side surfaces of the layer 120 on each side of the silicided fins 112. The result is shown in FIG. 10.

Figure 11:
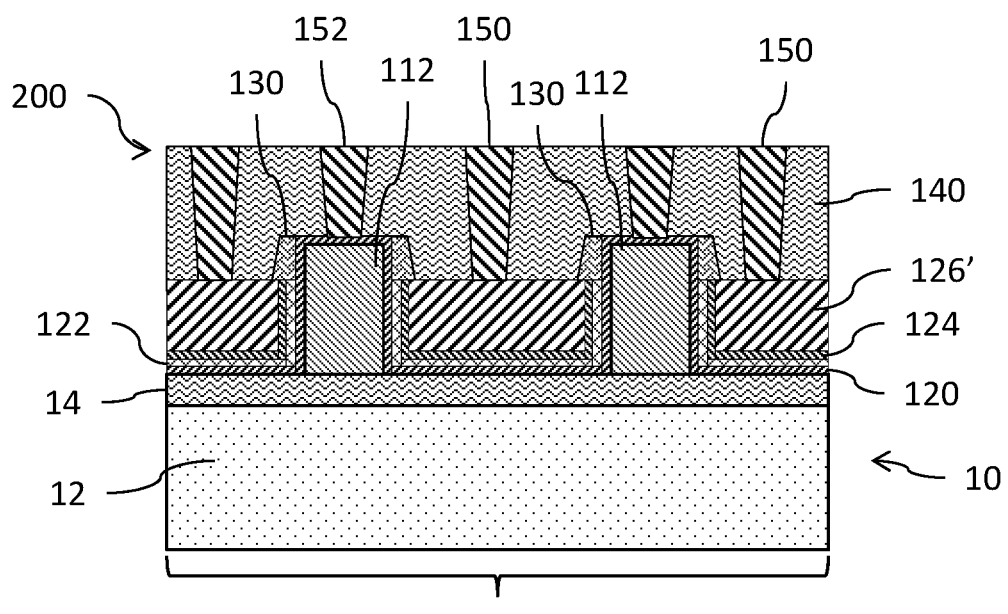

Conventional back end of line (BEOL) processes are then performed to deposit and planarize the premetallization dielectric (PMD) layer 140 and form metal contacts 150 and 152. The result is shown in FIG. 11. One or more metallization layers may then be provided above the PMD layer 140 to assist with making circuit interconnections to the contacts 150 and 152.

Figure 12:
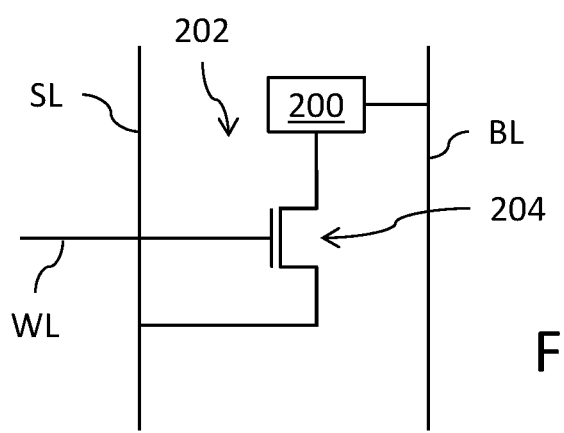
FIG. 12 is a schematic diagram of a non-volatile memory cell incorporating the RRAM structure.

A resistive random access memory structure 200 is accordingly formed to include a first metal plate or electrode (layer 120 on silicided fin 112), a dielectric layer 122, and a second metal plate (layer 124 and recessed fill 126'). It will be noted that the structure 200 is comprised of two fins 112, but this is by example only, it being understood that each structure 200 may be formed from the patterning and siliciding of any suitable number of fins 112. The structure 200 may be included in a non-volatile memory cell 202 as schematically shown in FIG. 12. The cell 202 includes a transistor 204 having a first source-drain region connected to the first metal plate of structure 200 through contact 152 and a second source-drain region connected to a source line SL. The transistor 204 may be supported by and integrated within the substrate 10, with the transistor fabricated prior to or contemporaneously with the fabrication of the structure 200 using well-known transistor fabrication techniques. A word line (WL) for the cell 202 is connected to a gate terminal of the transistor 204. A bit line (BL) for the cell 202 is connected to the second metal plate of structure 200 through contact 150. The source line, word line and bit line may be provided using (and/or coupled to) the metallization layers.

The structure formed supports high density RRAM fabrication because of the use of fins.

Operation of the RRAM structure in a memory cell is as follows: when the word line is set to logic high, the transistor 204 is turned on. The source line is pre-set to logic high. If the bit line voltage is set to >0.85V, a conduction filament is formed in the hafnium oxide dielectric layer. Current rises and the cell enters the low resistive state. The source line is then discharged and the voltage reduces. When the bit line voltage is set lower than −1.25V (which is the reset voltage), and when the word line is set to logic high, the conduction filament dissolves and the cell returns to the high resistive state.

Reference is now made to FIGS. 13-23 which illustrate the process steps in the formation of an RRAM structure for use in a non-volatile memory cell. It will be understood that the drawings do not necessarily show features drawn to scale.

Figure 13:
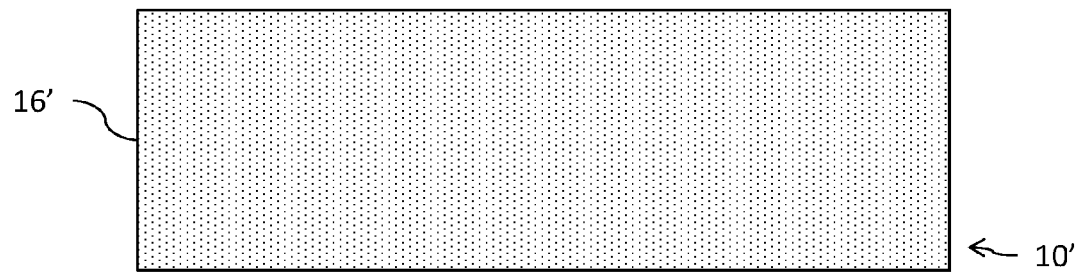
FIGS. 13-23 illustrate process steps in the formation of an RRAM structure for use in a non-volatile memory cell.

FIG. 13 shows a bulk semiconductor substrate 10' comprising a semiconductor layer 16'. The semiconductor layer 16' may be doped in accordance with the application, or alternatively may be un-doped. The semiconductor layer 16' may, for example, have a thickness of 30-80 nm.

Figure 14:
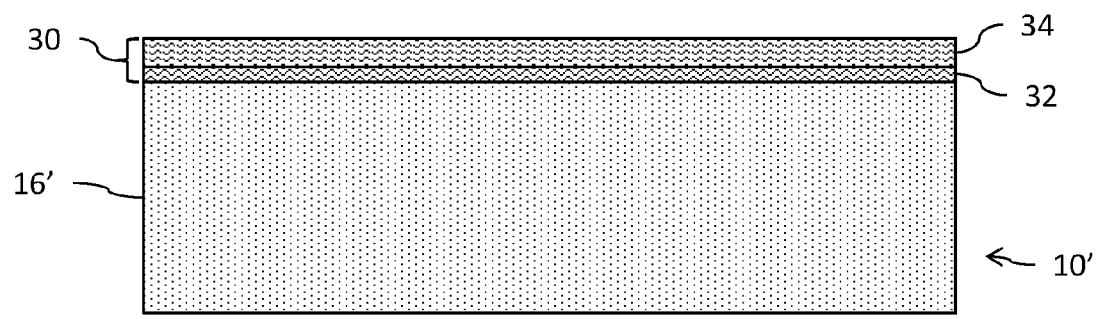

A hard mask 30 comprising a layer of silicon dioxide ($SiO_2$) 32 and a layer of silicon nitride (SiN) 34 is then deposited on the semiconductor layer 16'. The silicon dioxide layer 32 may, for example, be deposited using a chemical vapor deposition (CVD) process with a thickness of, for example, approximately 3-10 nm. The silicon nitride layer 34 may, for example, be deposited using a chemical vapor deposition (CVD) process with a thickness of, for example, approximately 20-40 nm. The result is shown in FIG. 14.

Figure 15:
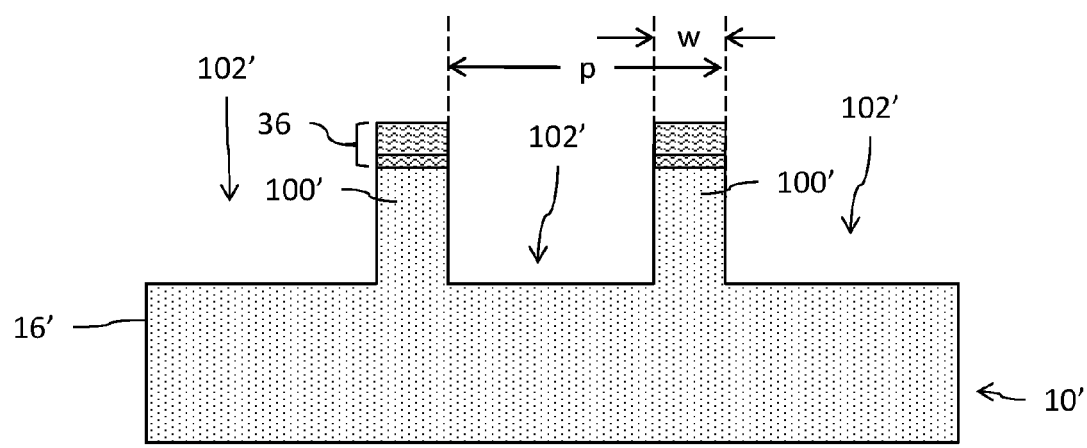

A lithographic process as known in the art is then used to define a plurality of fins 100' from an upper portion of the semiconductor layer 16'. The hard mask 30 is patterned to leave mask material 36 at the desired locations of the fins 100'. An etching operation is then performed through the mask to open apertures 102' on each side of each fin 100'. In a preferred embodiment, the etch which defines the fins 100' extends to a depth of 35-50 nm from the top surface of the semiconductor layer 16'. The fins 100 may have a width (w) of 6-12 nm and a pitch (p) of 25-45 nm (with a spacing between adjacent fins of 15-35 nm). The result of the etching process is shown in FIG. 15.

Figure 16:
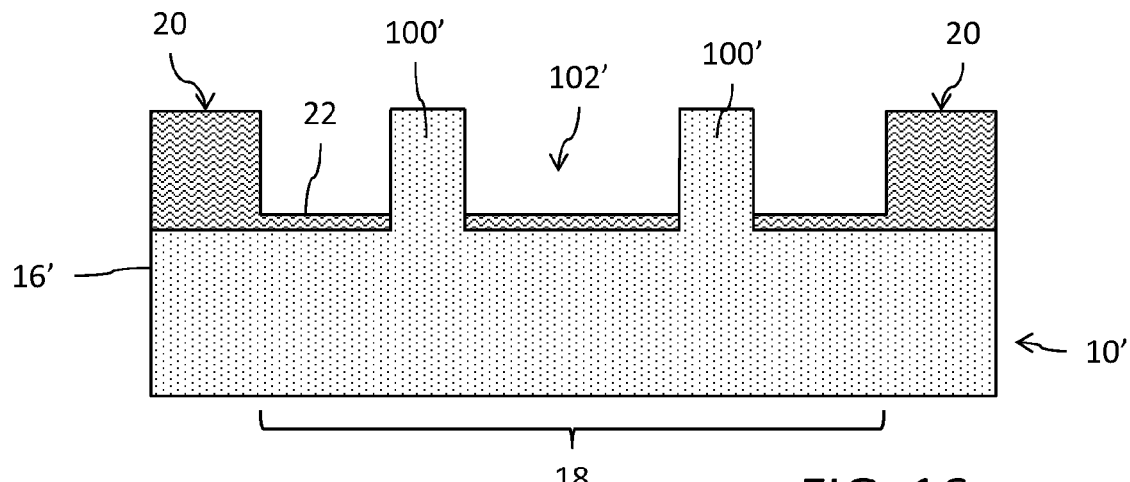

A deposit of a flowable oxide material is made and then planarized using a chemical-mechanical polishing (CMP) process. Within an area 18 where the fins 100 are located, the flowable oxide material deposit is recessed using a dry etch process to leave an insulating layer 22 surrounding a bottom portion 114 of the fins 100'. Outside of the area 18, the insulation is elevated as shown at reference 20. The mask material 36 is also removed. The result is shown in FIG. 16.

Figure 17:
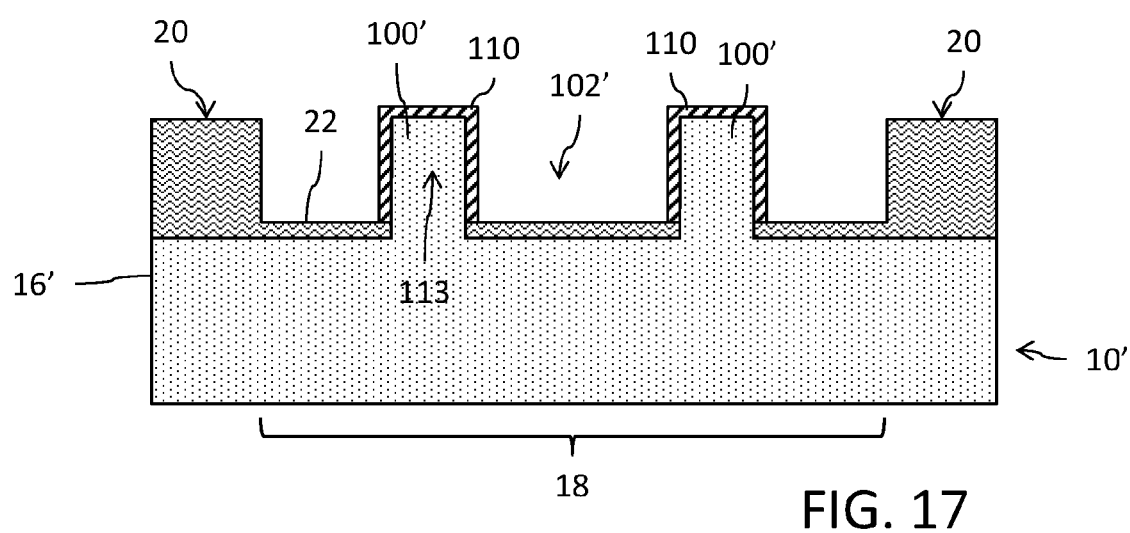
Figure 18:
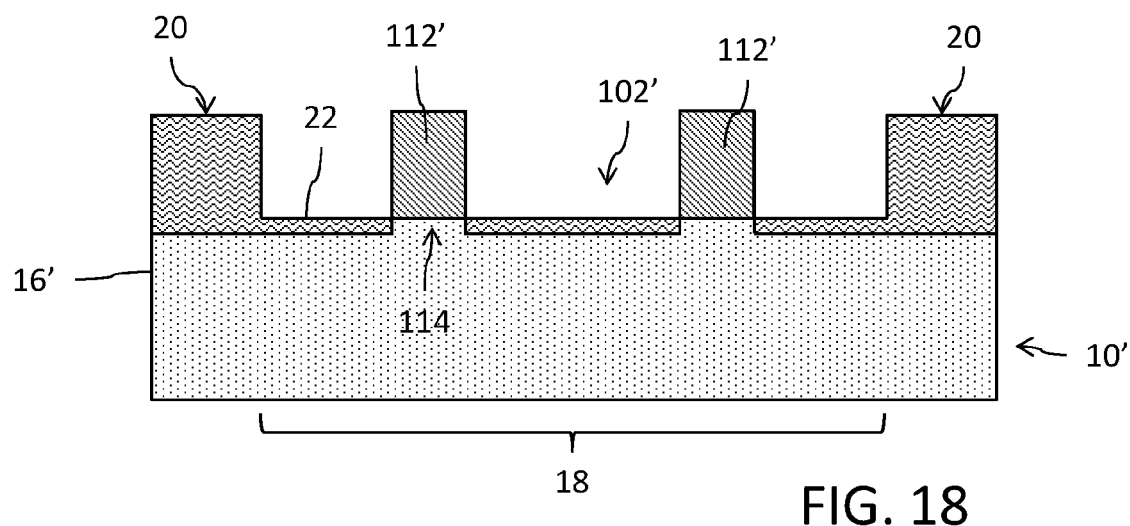

A layer 110 of nickel-platinum (NiPt) is then deposited to cover the fins 100' as shown in FIG. 17. The layer 110 may, for example, have a thickness of 3-10 nm. An anneal is then performed (for example, at 400° C. with an optional laser anneal at 800° C.). The anneal converts at least a portion of the silicon material in an upper portion 113 of the fins 100' to a metal silicide (for example, $NiSi_x$) so as to convert the silicon fin material to form silicided fins 112'. The unreacted portion of the layer 110 is removed. In an embodiment, the dimensions of the fin 100', the thickness of the layer 110', materials used and characteristics of the anneal performed are selected so that the silicided fins 112' are fully-silicided structures (in such a case, all of the semiconductor material of fin 100' in the upper portion 113 is converted to silicide). The result is shown in FIG. 18. It will be noted that the bottom portion 114 of the fin 100' made of non-silicided semiconductor material remains to support each fin 112'. The silicided fin 112' provides one electrode of the RRAM structure.

Figure 19:
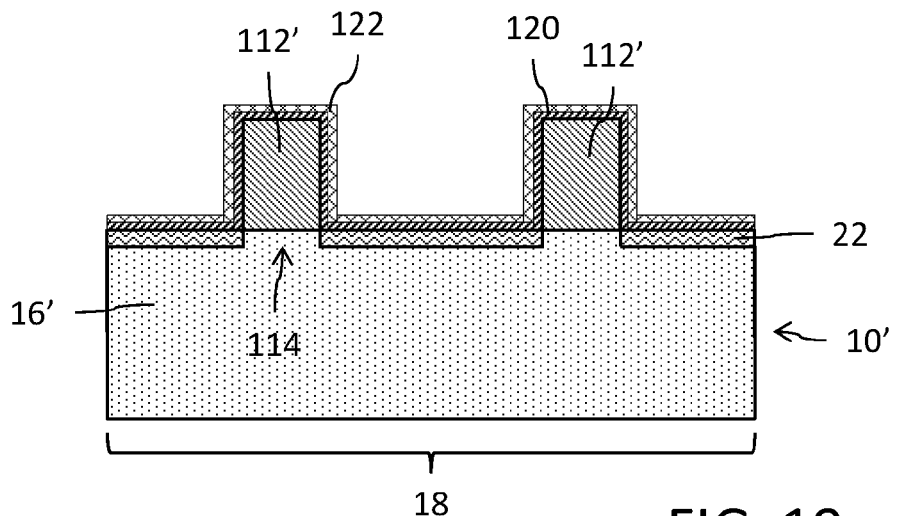

Using a chemical vapor deposition (CVD) process, a liner layer 120 of a metal material (such as, for example, titanium nitride TiN) is deposited to cover the silicided fins 112' and the insulating layer 22. The layer 120 may, for example, have a thickness of 5-10 nm. Using an atomic layer deposition (ALD) process, a layer 122 of a dielectric material (such as, for example, hafnium oxide $HfO_2$) is deposited to cover the metal layer 120. A patterning operation is performed to permit removal of the layers 120 and 122 outside of the area 18. The result is shown in FIG. 19 which now focuses on the area 18. The layer 120 assists in the formation of a low resistivity state across the dielectric layer 122 for the RRAM operation.

Figure 20:
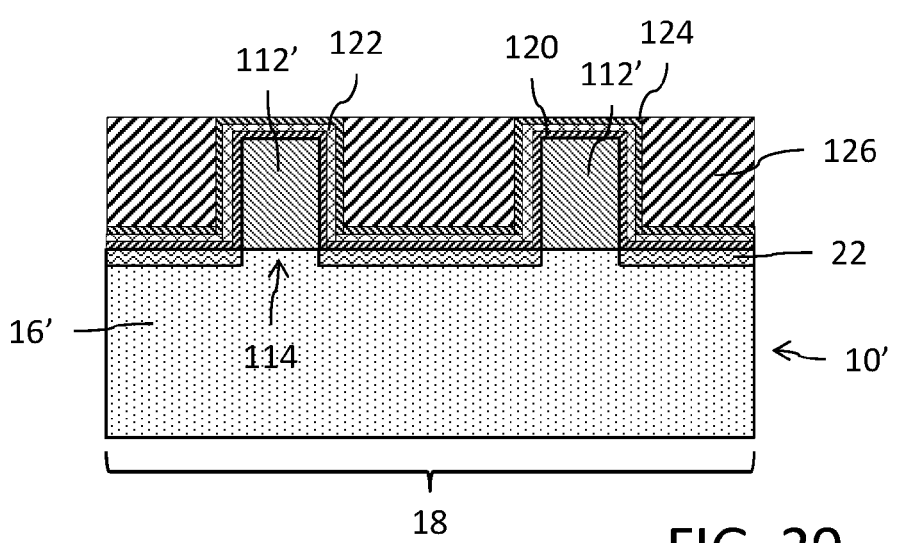

Using a chemical vapor deposition (CVD) process, a liner layer 124 of a metal material (such as, for example, titanium nitride TiN) is deposited to cover the layer 122. The layer 124 may, for example, have a thickness of 5-10 nm. The area 18 is then filled with a metal material (such as, for example, tungsten) to provide a metal fill 126. A chemical-mechanical polishing (CMP) operation is performed to planarize the top surface of the fill 126 at a level which is coplanar with the layer 124. The result is shown in FIG. 20. The layer 124 assists in the formation of a low resistivity state across the dielectric layer 122 for the RRAM operation. The metal fill 126 provides another electrode of the RRAM structure.

Figure 21:
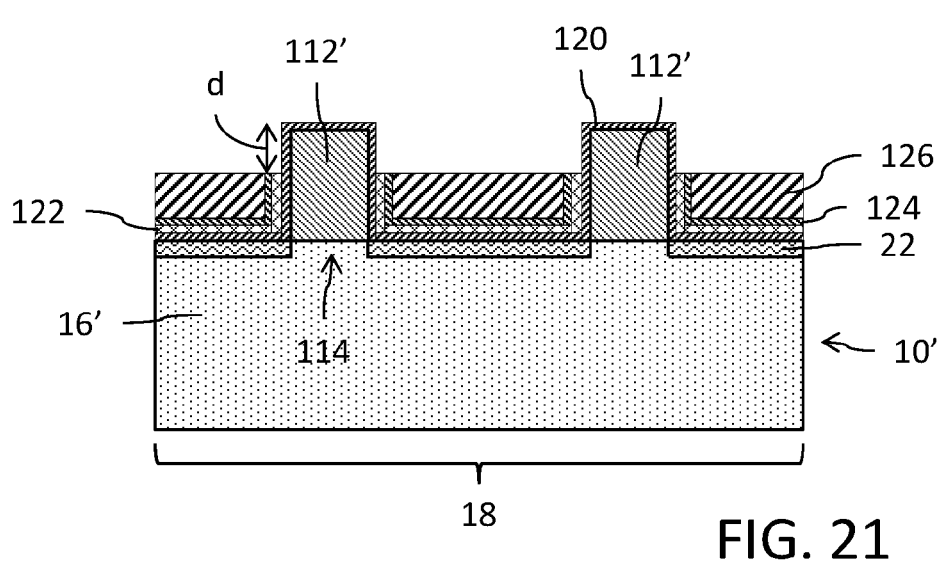

A wet etch process is then used to recess the top surface of the metal fill 126 to a level below the top surface of the silicided fins 112'. The depth d of this recess operation may, for example, be 10-20 nm. The portion of the layer 124 located above the top surface of the recessed metal fill 126' is also removed (for example, using a wet stripping process). The portion of the layer 122 located above the top surface of the recessed metal fill 126' is also removed (for example, using a wet stripping process). The result is shown in FIG. 21.

Figure 22:
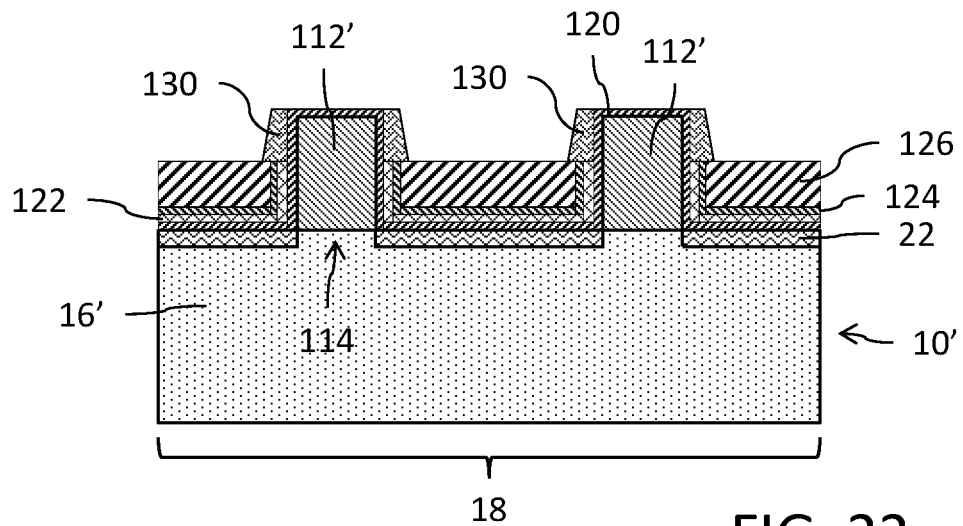

A conformal insulating material deposit is then made with a subsequent directional etch performed to define sidewall spacers 130 on the side surfaces of the layer 120 on each side of the silicided fins 112'. The result is shown in FIG. 22.

Figure 23:
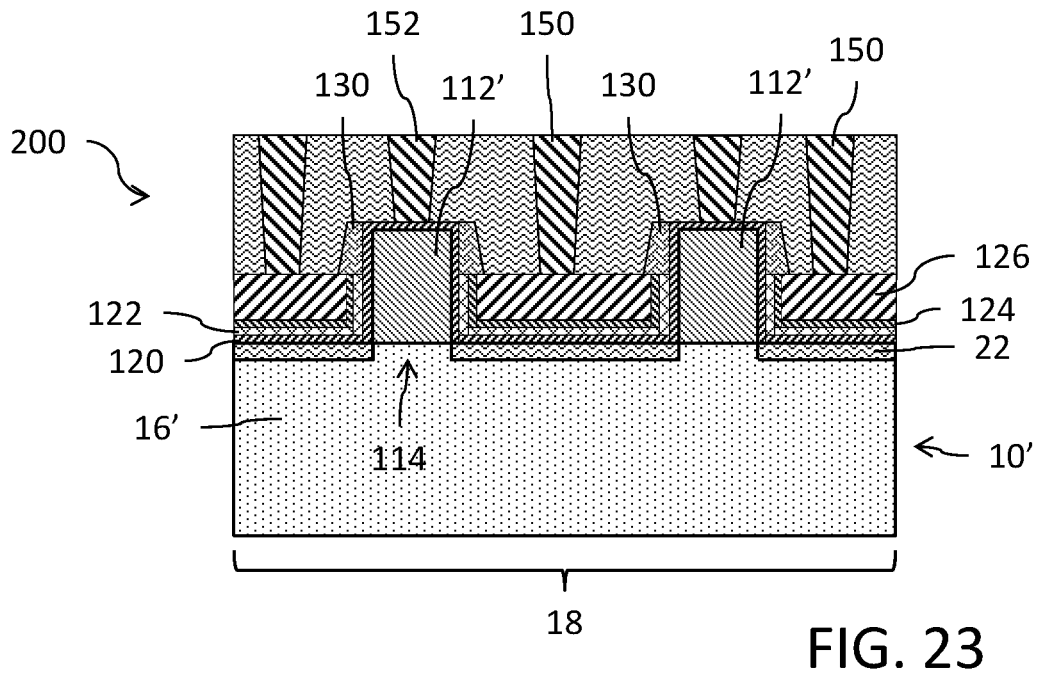

Conventional back end of line (BEOL) processes are then performed to deposit and planarize the premetallization dielectric (PMD) layer 140 and form metal contacts 150 and 152. The result is shown in FIG. 23. One or more metallization layers may then be provided above the PMD layer 140 to assist with making circuit interconnections to the contacts 150 and 152.

A resistive random access memory structure 200 is accordingly formed to include a first metal plate (layer 120 on silicided fin 112'), a dielectric layer 122, and a second metal plate (layer 124 and recessed fill 126'). It will be noted that the structure 200 is comprised of two fins 112', but this is by example only, it being understood that each structure 200 may be formed from the patterning and siliciding of any suitable number of fins 112'. The structure 200 may be included in a non-volatile memory cell 202 as schematically shown in FIG. 12 (previously described).

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:
1. A method, comprising:
   patterning a bulk semiconductor substrate to form a semiconductor fin supported by a substrate;
   siliciding the semiconductor fin to produce a silicided semiconductor fin;
   depositing a first metal liner layer covering said silicided semiconductor fin;
   depositing a layer of dielectric material having a configurable resistive property covering said first metal liner;

depositing a second metal liner layer covering said layer of dielectric material;
depositing a metal fill on each side of the silicided semiconductor fin in contact with the second metal liner layer;
making electrical contact to the first metal liner layer and silicided semiconductor fin to provide a first electrode of a resistive random access memory (RRAM) structure; and
making electrical contact to the metal fill and second metal liner layer to provide a second electrode of the RRAM structure.

2. The method of claim 1, further comprising:
recessing the layer of dielectric material, second metal liner layer and metal fill to a height below a top surface of the silicided semiconductor fin; and
forming sidewall spacers on each side of an upper portion the silicided semiconductor fin in contact with the first metal liner layer.

3. The method of claim 1, further comprising:
depositing a premetallization dielectric;
forming a first contact extending through the premetallization dielectric layer to electrically connect to the first metal liner layer at a top surface of the silicided semiconductor fin; and
forming a second contact extending through the premetallization dielectric layer to electrically connect to the metal fill and second metal liner layer.

4. The method of claim 1, wherein the layer of dielectric material is made of hafnium oxide.

5. The method of claim 1, further comprising:
fabricating an integrated circuit transistor supported by said substrate; and
electrically connecting the integrated circuit transistor to one of the first or second electrodes.

6. A method, comprising:
patterning a bulk semiconductor substrate to form a semiconductor fin supported by a substrate;
siliciding the semiconductor fin to produce a fully-silicided semiconductor fin;
depositing a first metal liner layer covering said fully-silicided semiconductor fin;
depositing a layer of dielectric material having a configurable resistive property covering said first metal liner;
depositing a second metal liner layer covering said layer of dielectric material;
depositing a metal fill on each side of the fully-silicided semiconductor fin in contact with the second metal liner layer;
making electrical contact to the first metal liner layer and fully-silicided semiconductor fin to provide a first electrode of a resistive random access memory (RRAM) structure; and
making electrical contact to the metal fill and second metal liner layer to provide a second electrode of the RRAM structure.

7. The method of claim 6, further comprising:
recessing the layer of dielectric material, second metal liner layer and metal fill to a height below a top surface of the fully-silicided semiconductor fin; and
forming sidewall spacers on each side of an upper portion the fully-silicided semiconductor fin in contact with the first metal liner layer.

8. The method of claim 6, further comprising:
depositing a premetallization dielectric;
forming a first contact extending through the premetallization dielectric layer to electrically connect to the first metal liner layer at a top surface of the fully-silicided semiconductor fin; and
forming a second contact extending through the premetallization dielectric layer to electrically connect to the metal fill and second metal liner layer.

9. The method of claim 6, wherein the layer of dielectric material is made of hafnium oxide.

10. The method of claim 6, wherein said supporting substrate is of a silicon on insulator (SOI) type.

11. The method of claim 6, further comprising:
fabricating an integrated circuit transistor supported by said substrate; and
electrically connecting the integrated circuit transistor to one of the first or second electrodes.

12. A method, comprising:
patterning a bulk semiconductor substrate to form a semiconductor fin supported by a substrate;
siliciding the semiconductor fin to produce a silicided semiconductor fin;
depositing a layer of dielectric material having a configurable resistive property over the silicided semiconductor fin;
depositing a metal material over the layer of dielectric material;
making electrical contact to the silicided semiconductor fin to provide a first electrode of a resistive random access memory (RRAM) structure; and
making electrical contact to the metal material to provide a second electrode of the RRAM structure.

13. The method of claim 12, further comprising:
recessing the layer of dielectric material and metal material to a height below a top surface of the silicided semiconductor fin; and
forming sidewall spacers on each side of an upper portion the silicided semiconductor fin.

14. The method of claim 12, further comprising:
depositing a premetallization dielectric;
forming a first contact extending through the premetallization dielectric layer to electrically connect to the silicided semiconductor fin; and
forming a second contact extending through the premetallization dielectric layer to electrically connect to the metal material.

15. The method of claim 14, further comprising:
fabricating an integrated circuit transistor supported by said substrate; and
electrically connecting the integrated circuit transistor to one of the first or second electrodes.

16. The method of claim 12, wherein the layer of dielectric material is made of hafnium oxide.

* * * * *